(12) United States Patent
Huang et al.

(10) Patent No.: US 9,607,880 B2
(45) Date of Patent: Mar. 28, 2017

(54) SILICON-ON-INSULATOR SUBSTRATE AND METHOD OF MANUFACTURING THEREOF

(71) Applicant: Semiconductor Manufacturing International (Shanghai) Corporation, Shanghai (CN)

(72) Inventors: Herb He Huang, Shanghai (CN); Clifford I. Drowley, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 14/341,487

(22) Filed: Jul. 25, 2014

(65) Prior Publication Data
US 2015/0187639 A1    Jul. 2, 2015

(30) Foreign Application Priority Data

Dec. 27, 2013    (CN) .......................... 2013 1 0740266

(51) Int. Cl.
| | | |
|---|---|---|
| H01L 21/70 | (2006.01) | |
| H01L 21/762 | (2006.01) | |
| H01L 21/84 | (2006.01) | |
| H01L 27/12 | (2006.01) | |

(52) U.S. Cl.
CPC .. *H01L 21/76283* (2013.01); *H01L 21/76254* (2013.01); *H01L 21/84* (2013.01); *H01L 27/1203* (2013.01)

(58) Field of Classification Search
CPC ......... H01L 21/02104; H01L 21/02107; H01L 21/02123; H01L 21/02164; H01L 21/762; H01L 21/76224; H01L 21/76283; H01L 21/7624–21/76256; H01L 27/1203
USPC .......................... 438/455, 458; 257/455, 458
See application file for complete search history.

(56) References Cited

U.S. PATENT DOCUMENTS

| | | | | |
|---|---|---|---|---|
| 4,549,926 A | * | 10/1985 | Corboy et al. ................ 438/412 |
| 4,874,718 A | * | 10/1989 | Inoue .................. H01L 21/2022 |
| | | | | 148/DIG. 85 |
| 5,374,564 A | * | 12/1994 | Bruel ...................... B28D 1/005 |
| | | | | 148/DIG. 12 |

(Continued)

OTHER PUBLICATIONS

Long et al. "Study of Excimer Laser Electrochemical Etching Silicon", Proceedings of the 2nd IEEE International Conference on Nano/Micro Engineered and Molecular Systems, pp. 117-121. Published by IEEE in 2007.*

(Continued)

*Primary Examiner* — Jesse Y Miyoshi
*Assistant Examiner* — Tuan A Hoang
(74) *Attorney, Agent, or Firm* — Innovation Counsel LLP (57) ABSTRACT

A method of manufacturing a silicon-on-insulator (SOI) substrate is provided. The method includes forming an island-shaped insulating layer on a first surface of a first semiconductor substrate in a first region, forming a silicon epitaxial layer on the first surface of the first semiconductor substrate so as to cover the island-shaped insulating layer, forming a trench by etching the silicon epitaxial layer so as to expose the island-shaped insulating layer, and forming a first insulating adhesive layer on the silicon epitaxial layer and the island-shaped insulating layer so as to fill the trench.

10 Claims, 6 Drawing Sheets

(56) References Cited

U.S. PATENT DOCUMENTS

| | | | |
|---|---|---|---|
| 6,955,971 B2* | 10/2005 | Ghyselen | H01L 21/76243 |
| | | | 257/E21.563 |
| 7,402,477 B2* | 7/2008 | Sadaka | H01L 21/82341 |
| | | | 257/E21.618 |
| 8,936,996 B2* | 1/2015 | Todi et al. | 438/425 |
| 2002/0004286 A1* | 1/2002 | Atoji | B01D 46/48 |
| | | | 438/459 |
| 2007/0202660 A1* | 8/2007 | Moriceau et al. | 438/424 |
| 2012/0329218 A1* | 12/2012 | Zhou | H01L 29/785 |
| | | | 438/166 |
| 2013/0302971 A1* | 11/2013 | Chang | B28D 5/0047 |
| | | | 438/460 |

OTHER PUBLICATIONS

Gösele et al. "Semiconductor wafer bonding", Annual Review of Material Science 1998, vol. 28, pp. 215-241.*

Maszara, "Silicon-on-Insulator by Wafer bonding: A Review" in Journal of Electrochemical Society, vol. 138, pp. 341-347. Published by the Electrochemical Society, Inc. in 1991.*

Long et al., Proceedings of the 2nd IEEE International Conference on Nano/Micro Engineer and Molecular Systems, pp. 117-121. Published by IEEE in 2007.*

Maszara, W. P. "Silicon-on-Insulator by wafer bonding: a review" Journal of Electrochemical Society, vol. 138, p. 341. Published by ECS in 1991.*

Long et al., Proceedings of the 2nd IEEE International Conference on Nano/Micro Engineered and Molecular Systems, pp. 117-121. Published by IEEE in 2007.*

* cited by examiner

SILICON-ON-INSULATOR SUBSTRATE AND METHOD OF MANUFACTURING THEREOF

CROSS-REFERENCE TO RELATED APPLICATION

This application claims priority to Chinese Patent Application No. 201310740266.5 filed on Dec. 27, 2013, the disclosure of which is incorporated herein by reference in its entirety.

BACKGROUND

Technical Field

The present disclosure relates to the field of semiconductor technology, and more particularly to a silicon-on-insulator (SOI) substrate and a manufacturing method thereof.

Description of the Related Art

Transistors (e.g., MOSFETs (Metal-Oxide-Semiconductor Field Effect Transistors) formed using a silicon-on-insulator (SOI) substrate typically display improved performance compared to transistors formed on a bulk silicon substrate. For example, transistors formed using a SOI substrate are better suited for applications relating to RF (radio frequency) and high frequency modulation, power amplification/management, etc.

To meet the performance requirements for different applications, different types of transistors may be required. In particular, different transistors may require different types of source and drain regions, and also different semiconductor processes for forming the transistor well(s). To fabricate different transistors, different thicknesses of the buried oxide (BOX) layer and the topmost monocrystalline silicon layer in a SOI substrate may be required.

In a conventional SOI substrate, the topmost monocrystalline silicon layer (located above the BOX layer) generally has a uniform thickness over the entire substrate. However, as previously described, different thicknesses of the topmost monocrystalline silicon layer may be needed to fabricate transistors (having different device performance and structures) for different applications. As a result, it is difficult to fabricate different types of transistors on a single conventional SOI substrate. Thus, in the prior art, the different types of transistors are typically formed on different SOI substrates (each having a different monocrystalline silicon layer thickness), which increases the manufacturing costs and form factor of the semiconductor device.

SUMMARY

The present disclosure addresses at least the above deficiencies in conventional SOI substrates, by providing an exemplary SOI substrate including a monocrystalline silicon layer having different thicknesses above the BOX layer.

According to some embodiments of the inventive concept, a method of manufacturing a silicon-on-insulator (SOI) substrate is provided. The method includes: forming an island-shaped insulating layer on a first surface of a first semiconductor substrate in a first region; forming a silicon epitaxial layer on the first surface of the first semiconductor substrate so as to cover the island-shaped insulating layer; forming a trench by etching the silicon epitaxial layer so as to expose the island-shaped insulating layer; and forming a first insulating adhesive layer on the silicon epitaxial layer and the island-shaped insulating layer so as to fill the trench.

In some embodiments, forming the island-shaped insulating layer may further include: forming an oxide layer on the first surface of the first semiconductor substrate; forming a first hard mask layer on the first oxide layer; etching the oxide layer using the first hard mask layer as an etch mask, so as to remove portions of the oxide layer lying outside the first region; and removing the first hard mask layer.

In some embodiments, forming the trench may further include optically aligning the first semiconductor substrate, and etching the silicon epitaxial layer using a laser.

In some embodiments, forming the trench may further include: forming a second hard mask layer on a surface of the silicon epitaxial layer; forming an opening in the second hard mask layer in the first region by removing a portion of the second hard mask layer disposed above the island-shaped insulating layer; etching the silicon epitaxial layer using the second hard mask layer as an etch mask, so as to form the trench in the silicon epitaxial layer in the first region; and removing the second hard mask layer.

In some embodiments, the method may further include: bonding the first semiconductor substrate and a second semiconductor substrate using the first insulating adhesive layer and a second insulating adhesive layer disposed on the second semiconductor substrate, so as to form the SOI substrate.

In some embodiments, the method may further include planarizing the first insulating adhesive layer after forming the first insulating adhesive layer.

In some embodiments, the island-shaped insulating layer, the first insulating adhesive layer, and the second insulating adhesive layer may be formed of a same material.

In some embodiments, the method may further include: thinning the first semiconductor substrate from a second surface of the first semiconductor substrate, wherein the second surface may be disposed opposite the first surface of the first semiconductor substrate.

In some embodiments, the method may further include: forming a thinning stop layer in the first semiconductor substrate prior to forming the island-shaped insulating layer; and wherein the thinning of the first semiconductor substrate may terminate at the thinning stop layer.

In some embodiments, forming the thinning stop layer may further include: forming a first sacrificial layer on the first surface of the first semiconductor substrate; and performing ion implantation on the first surface of the first semiconductor substrate, so as to form the thinning stop layer in the first semiconductor substrate.

In some embodiments, the method may further include annealing the first semiconductor substrate after performing the ion implantation.

In some embodiments, at least one corner or edge of the first semiconductor substrate may be chamfered.

According to some other embodiments of the inventive concept, a silicon-on-insulator (SOI) substrate is provided. The SOI substrate includes: a first semiconductor substrate; a second semiconductor substrate; and a buried insulating layer disposed between the first semiconductor substrate and the second semiconductor substrate, wherein a thickness of the first semiconductor substrate is lower in a first region than in a second region.

In some embodiments, the buried insulating layer may include an island-shaped insulating layer, a first insulating adhesive layer, and a second insulating adhesive layer.

In some embodiments, the buried insulating layer may extend into the first region of the first semiconductor substrate.

In some embodiments, the island-shaped insulating layer may be disposed on a first surface of the first semiconductor substrate in the first region; a silicon epitaxial layer may be disposed on the first surface of the first semiconductor substrate so as to cover the island-shaped insulating layer; and a trench may be formed in the silicon epitaxial layer so as to expose the island-shaped insulating layer.

In some embodiments, the first insulating adhesive layer may be disposed on the silicon epitaxial layer and the island-shaped insulating layer of the first semiconductor substrate so as to fill the trench; and the second insulating adhesive layer may be disposed on the second semiconductor substrate.

In some embodiments, the first semiconductor substrate and the second semiconductor substrate may be bonded using the first insulating adhesive layer and the second insulating adhesive layer.

In some embodiments, the island-shaped insulating layer, the first insulating adhesive layer, and the second insulating adhesive layer may be formed of a same material.

BRIEF DESCRIPTION OF THE DRAWINGS

The accompanying drawings, which are incorporated herein and constitute a part of the specification, illustrate different embodiments of the inventive concept and, together with the description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Various embodiments of the inventive concept are next described with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate.

It should be understood that the inventive concept is not limited to the embodiments described herein. Rather, the inventive concept may be modified in different ways to realize different embodiments.

In the drawings, the sizes and/or relative sizes of layers and regions may be exaggerated for clarity. Like reference numerals denote the same elements throughout.

It should be understood that when an element or layer is referred to as being "adjacent", "connected to" or "coupled to" another element or layer, it can be disposed directly on, adjacent, connected, or coupled to the other element or layer, or with one or more intervening elements or layers being present. In contrast, when an element is referred to as being "directly on", "directly adjacent to," "directly connected to" or "directly coupled to" another element or layer, there are no intervening elements present or layers. It should be understood that although the terms "first," "second," "third," etc. can be used to describe various elements, components, areas, layers and/or sections, the elements, components, areas, layers and/or sections should not be limited by those terms. Rather, those terms are merely used to distinguish one element, component, region, layer or section from another element, component, region, layer or section. Therefore, a "first" element, component, region, layer or section may also be expressed as a "second" element, component, region, layer or section in other contexts without departing from the teachings of the present disclosure. It will be understood that, although the terms "first", "second", etc. may be used herein to describe various elements, components, regions, layers and/or sections, the elements, components, regions, layers and/or sections should not be limited by those terms. Those terms are only used to distinguish one element, component, region, layer or section from another region, layer or section. Thus, a first element, component, region, layer or section described below could be termed a second element, component, region, layer or section without departing from the teachings of the present disclosure.

Spatially relative terms, such as "beneath", "below", "lower", "above", "upper" and the like, may be used herein for ease of description to describe one element or feature's spatial relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended limit the inventive concept. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

The inventive concept will be herein described with reference to cross-sections of intermediate and final structures of different embodiments. The cross-sections are merely illustrative and are not drawn to scale. Furthermore, it should be noted that the shapes of the intermediate and final structures may vary due to different tolerances in manufacturing. As such, the inventive concept is not limited to the embodiments illustrated in the drawings, but may further include variations in shapes as a result of different manufacturing tolerances. For example, an implanted region (depicted as a rectangle in the drawings) may have generally rounded or curved edges depending on the gradient in the ion implant concentration. Therefore, the areas/shapes illustrated in the figures are merely schematic, and should not be construed to limit the inventive concept.

According to an embodiment of the inventive concept, a SOI substrate is provided. The SOI substrate includes a BOX layer and a first semiconductor substrate formed above the BOX layer. The first semiconductor substrate may include a monocrystalline silicon substrate. The BOX layer may include a plurality of regions, and the first semiconductor substrate may be formed having different thicknesses in different regions above the BOX layer. Accordingly, different types of transistors (having different layer thickness requirements and structures) can be fabricated using the first semiconductor substrate. In other words, different types of transistors can be fabricated on a single SOI substrate according to the above embodiment of the inventive concept. Thus, the exemplary SOI substrate can reduce packaging costs, and enable chip-scale packages (CSPs) having reduced feature sizes and improved device performance.

First, an exemplary method of manufacturing a SOI substrate according to an embodiment of the inventive concept will be described with reference to FIGS. 1A to 1G and FIG. 2. Specifically, FIGS. 1A to 1G depict cross-sectional views of the SOI substrate at different stages of manufacture, and FIG. 2 is a flowchart of the steps in manufacturing the SOI substrate.

Figure 1A:
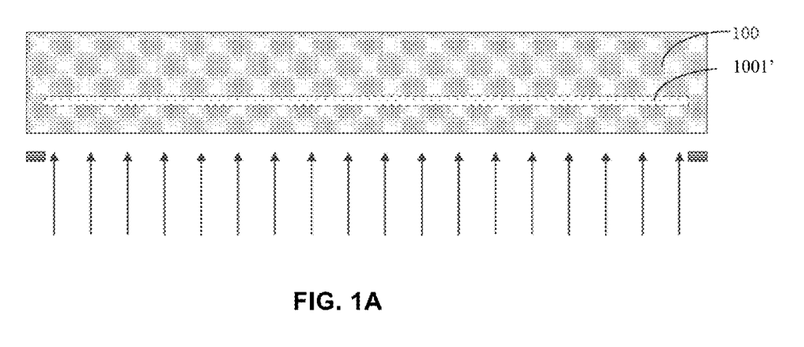
FIGS. 1A to 1G depict cross-sectional views of a SOI substrate at different stages of fabrication according to a method of manufacturing the SOI substrate.
Figure 2:
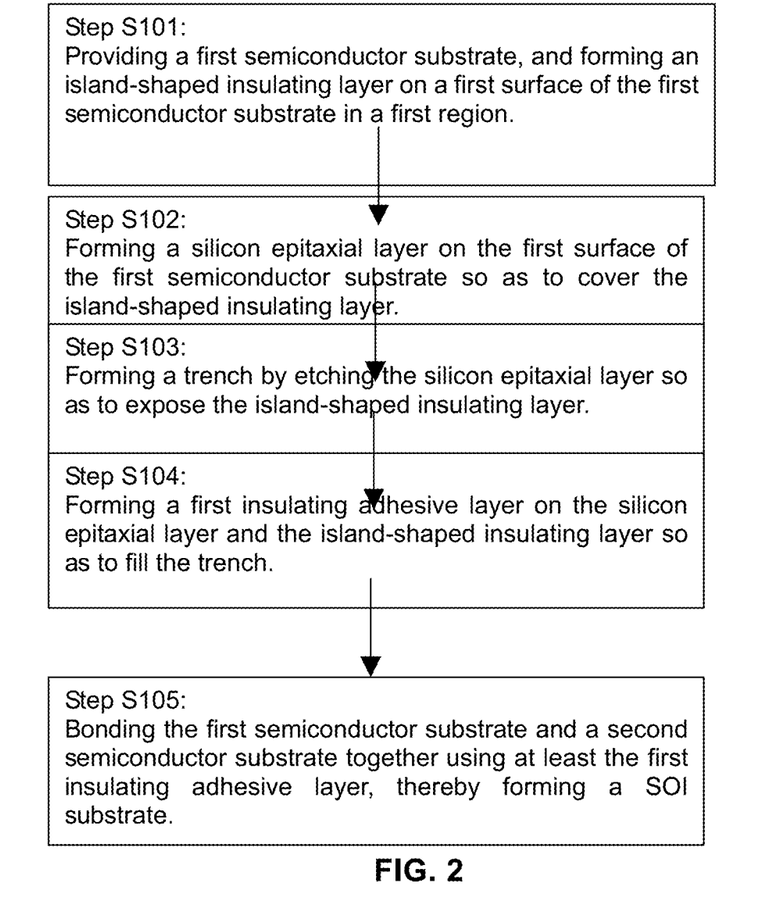
FIG. 2 is a flow diagram of an exemplary method of manufacturing a SOI substrate according to an embodiment of the inventive concept.

Referring to FIG. 1A, a first semiconductor substrate 100 is provided. A thinning stop layer 1001 is then formed in the first semiconductor substrate 100, as described below.

First, a first sacrificial layer (not illustrated) is formed on a first surface of the first semiconductor substrate 100. The first sacrificial layer may be formed of an oxide or any other appropriate sacrificial material.

Next, ion implantation is performed on the first surface of the first semiconductor substrate 100 (the ion implantation depicted by the arrows indicated in FIG. 1A), so as to form an ion implantation layer 1001' within the first semiconductor substrate 100. In some embodiments, the ion implantation may include hydrogen ion implantation.

A distance between the ion implantation layer 1001' from the first surface of the semiconductor substrate 100 can be set depending on actual device requirements. For example, the distance between the ion implantation layer 1001' from the first surface of the semiconductor substrate 100 can be set by adjusting a thickness of the first sacrificial layer and/or the ion implantation process conditions.

The ion implantation layer 1001' constitutes the thinning stop layer 1001 (after the ion implantation is complete).

In some embodiments, the first semiconductor substrate 100 may undergo annealing after the ion implantation. The annealing may include subjecting the first semiconductor substrate 100 to a high temperature annealing process (or any other appropriate annealing process).

It should be noted that the thinning stop layer 1001 can be formed within the first semiconductor substrate 100 using other semiconductor processing techniques, and that the formation of the thinning stop layer 1001 need not be limited to the above-described embodiment.

Next, an island-shaped insulating layer 101 is formed on the first surface of the first semiconductor substrate 100 in a first region A1, as described below with reference to FIGS. 1B and 1C. The island-shaped insulating layer 101 may be formed of an oxide or any other appropriate dielectric material.

Figure 1B:
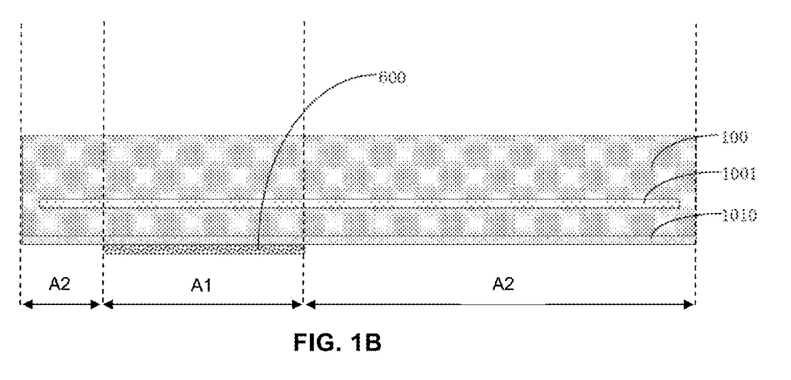

Referring to FIG. 1B, an oxide layer 1010 is formed on the first surface of the first semiconductor substrate 100. Next, a first hard mask layer 600 is formed on a surface of the oxide layer 1010 in the first region A1. The first hard mask layer 600 may be formed of silicon nitride or any other appropriate etch stop material.

Figure 1C:
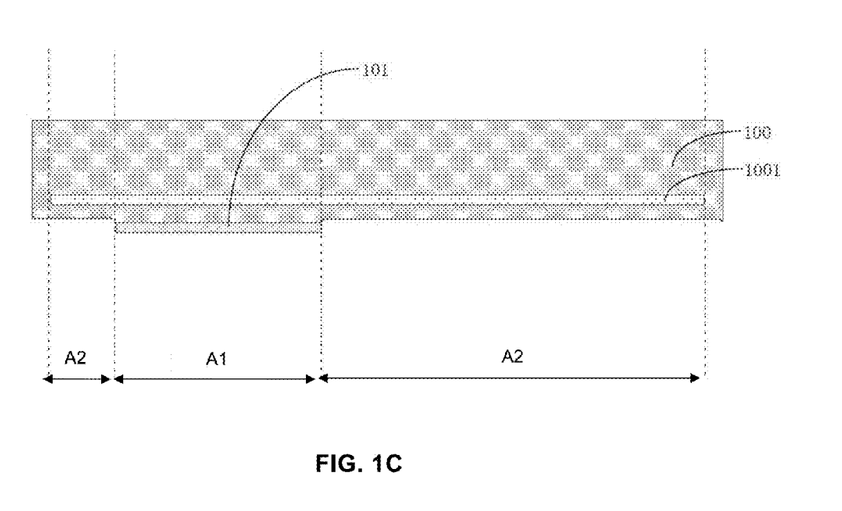

The oxide layer 1010 is then etched using the first hard mask layer 600 as an etch mask, so as to form the island-shaped insulating layer 101 illustrated in FIG. 1C. After the island-shaped insulating layer 101 is formed, the first hard mask layer 600 is then removed. As shown in FIG. 1C, the island-shaped insulating layer 101 is formed in the first region A1, whereas portions of the first surface of the first semiconductor substrate 100 are exposed in the second regions A2.

In some embodiments, a second sacrificial layer (not illustrated) may be formed on portions of the first surface of the first semiconductor substrate 100 prior to etching the oxide layer 1010. More specifically, the second sacrificial layer may be formed in the second regions A2 that are not covered by the first hard mask layer 600. The second sacrificial layer may be formed by thermal oxidation.

Subsequently, the second sacrificial layer and the oxide layer 1010 may be etched using the first hard mask layer 600 as an etch mask, so as to form the island-shaped insulating layer 101 illustrated in FIG. 1C.

It should be noted that the method for forming the structure illustrated in FIG. 1C is not limited to the above, and that those of ordinary skill in the art would appreciate that other semiconductor processing methods can be used to form the structure illustrated in FIG. 1C.

Figure 1D:
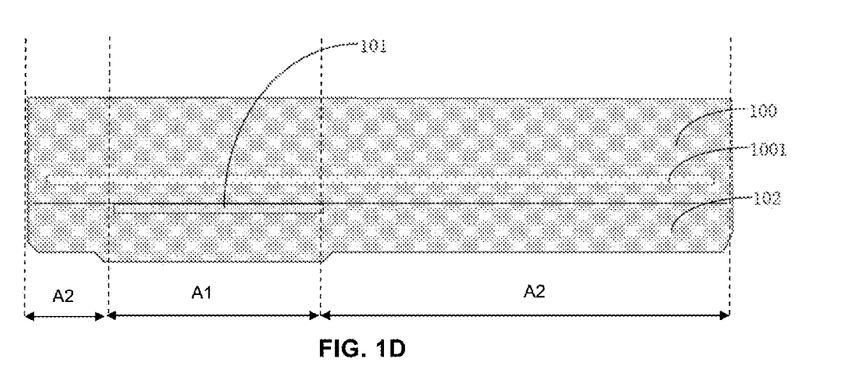

Next, referring to FIG. 1D, a silicon epitaxial layer 102 is formed on the first surface of the first semiconductor substrate 100 covering the island-shaped insulating layer 101. The silicon epitaxial layer 102 may be grown epitaxially or formed using any other appropriate deposition techniques. As shown in FIG. 1D, a dotted line denotes a boundary/interface between the first surface of the first semiconductor substrate 100 and an inner surface of the silicon epitaxial layer 102. Specifically, the island-shaped insulating layer 101 is disposed below the dotted line, and embedded within the structure of FIG. 1D.

In some preferred embodiments, the silicon epitaxial layer 102 may be formed of a same material as the first semiconductor substrate 100. In other embodiments, the silicon epitaxial layer 102 and the first semiconductor substrate 100 may be formed of different materials. In the interest of brevity, the silicon epitaxial layer 102 may be included as part of the first semiconductor substrate 100 when describing some of the following embodiments.

Next, a second hard mask layer 1020 is formed on a surface of the silicon epitaxial layer 102. The second hard mask layer 1020 may be formed of silicon nitride or any other appropriate etch mask material. An opening is then patterned in the second hard mask layer 1020 in the first region A1. Specifically, a portion of the second hard mask layer 1020 disposed above the island-shaped insulating layer 101 is removed during the patterning.

Figure 1E:
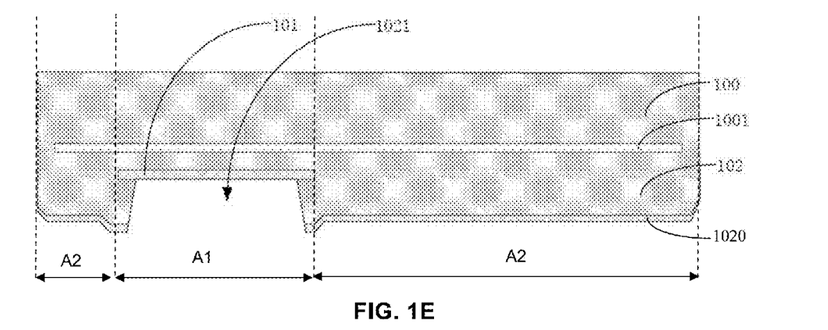

Next, the silicon epitaxial layer 102 is etched using the patterned second hard mask layer 1020, so as to form a trench 1021 in the silicon epitaxial layer 102 (in the first region A1). As shown in FIG. 1E, a portion of the island-shaped insulating layer 101 is exposed by the trench 1021, with the exposed portion of the island-shaped insulating layer 101 corresponding to a bottom surface of the trench 1021.

In the embodiment of FIGS. 1A to 1G, the second hard mask layer 1020 remains on the first surface of the first semiconductor substrate 100 after the trench 1021 has been formed. Nevertheless, in some other embodiments (not illustrated), the second hard mask layer 1020 may be removed after the trench 1021 has been formed.

In some alternative embodiments, the trench 1021 is formed by optically aligning the first semiconductor substrate 100 and etching the silicon epitaxial layer 102 using a laser. Accordingly, in those alternative embodiments, the second hard mask layer 1020 may be omitted since an etch mask may not be required.

In some embodiments, the presence of the island-shaped insulating layer 101 allows the position and depth of the trench 1021 to be more precisely controlled, thereby ensuring that the subsequently-formed buried insulating layer (e.g. BOX layer) will have good morphology.

Figure 1F:
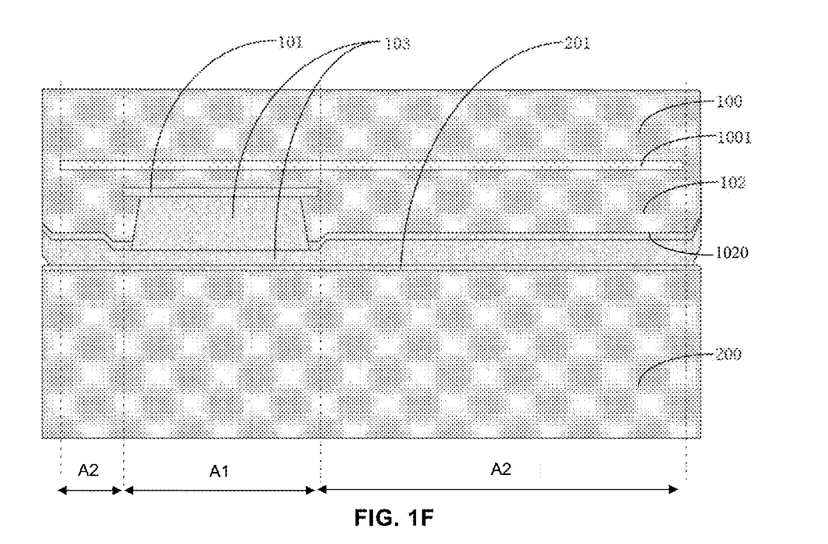

Next, referring to FIG. 1F, a first insulating adhesive layer 103 is formed on the silicon epitaxial layer 102 over the first surface of the first semiconductor substrate 100. Specifically, the first insulating adhesive layer 103 is formed directly on the second hard mask layer 1020 and the island-shaped insulating layer 101, and fills the trench 1021.

Referring to FIG. 1F, a second semiconductor substrate 200 is also provided. The second semiconductor substrate 200 includes a second insulating adhesive layer 201 formed on a first surface of the second semiconductor substrate 200.

Next, the first semiconductor substrate 100 and the second semiconductor substrate 200 are bonded together at the first insulating adhesive layer 103 and the second insulating adhesive layer 201, thereby forming the SOI substrate illustrated in FIG. 1F. In some embodiments, the first insulating adhesive layer 103 may undergo a planarization step prior to the bonding, so as to improve the adhesion between the first semiconductor substrate 100 and the second semiconductor substrate 200.

The first insulating adhesive layer 103 and the second insulating adhesive layer 201 may each be formed of an oxide or any other appropriate adhesive dielectric material. In some preferred embodiments, the island-shaped insulating layer 101, the first insulating adhesive layer 103, and the second insulating adhesive layer 201 may be formed of a same material. For example, the island-shaped insulating layer 101, the first insulating adhesive layer 103, and the second insulating adhesive layer 201 may be formed of an oxide.

When forming the SOI substrate illustrated in FIG. 1F, the second semiconductor substrate 200 may serve as a supporting substrate. The island-shaped insulating layer 101, the first insulating adhesive layer 103, and the second insulating adhesive layer 201 collectively constitute the buried oxide (BOX) layer. The first semiconductor substrate 100 (including the silicon epitaxial layer 102) located above the BOX layer constitutes a monocrystalline silicon substrate.

As shown in FIG. 1F, a first portion of the monocrystalline silicon substrate located above the BOX layer in the first region A1 has a lower thickness than a second portion of the monocrystalline silicon substrate located above the BOX layer in the second regions A1. Accordingly, the monocrystalline silicon substrate located above the BOX layer is formed having different thicknesses in different regions.

In some particular embodiments, the second insulating adhesive layer 201 may be omitted, and the second semiconductor substrate 200 may be provided as a bare substrate. In those particular embodiments, the first semiconductor substrate 100 and the second semiconductor substrate 200 may be bonded together using the first insulating adhesive layer 103 (on the first semiconductor substrate 100), so as to form an SOI substrate.

It should be noted that the inventive concept is not limited to the structure illustrated in FIG. 1F. For example, in some other embodiments, the SOI substrate may further include one or more intervening layers disposed between the first insulating adhesive layer 103 and the second insulating adhesive layer 201.

Figure 1G:
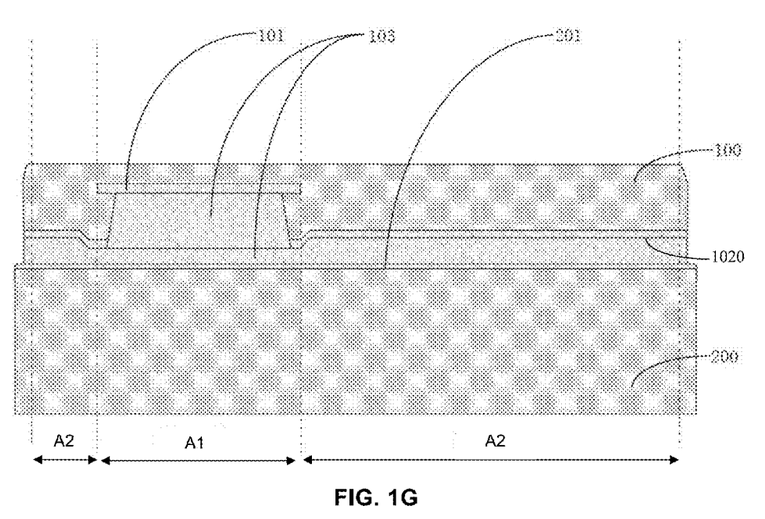

Next, the SOI substrate in FIG. 1F is thinned, so as to obtain the resulting structure illustrated in FIG. 1G. Referring to FIG. 1G, a second surface (disposed opposite the first surface) of the first semiconductor substrate 100 undergoes lapping. As a result, a thickness of the first semiconductor substrate 100 may be substantially reduced after the lapping. The thinning or lapping may include chemical mechanical polishing (CMP), wafer grinding, or any other appropriate wafer/die thinning methods.

The thinning stop layer 1001 can be used to control the endpoint of the lapping process. For example, the first semiconductor substrate 100 may undergo coarse grinding until the thinning stop layer 1001 is exposed, and fine grinding to carefully remove the thinning stop layer 1001. Since the distances of the thinning stop layer 1001 from both the first and second surfaces of the first semiconductor substrate 100 are known (or can be set), it is thus possible to know the thickness of the first semiconductor substrate 100 that is removed by the lapping. As shown in FIG. 1G, the first semiconductor substrate 100 is lapped beyond the thinning stop layer 1001, such that the thinning stop layer 1001 is removed by the lapping.

In some alternative embodiments, the thinning stop layer 1001 may be omitted if the thinning or lapping process can be accurately controlled to remove a predetermined thickness.

In some embodiments, the first semiconductor substrate 100 need not undergo thinning if the original thickness of the first semiconductor substrate 100 meets the device/structural requirements.

In some embodiments, the second surface of the thinned first semiconductor substrate 100 may be chamfered (as shown in FIG. 1G), so as to reduce the risk of chipping at the edges/corners of the first semiconductor substrate 100.

Accordingly, an exemplary method of manufacturing a SOI substrate according to an embodiment of the inventive concept has been described above with reference to FIGS. 1A to 1G. In particular, the monocrystalline silicon substrate located above the BOX layer is formed having different thicknesses in different regions. As a result, different types of transistors having different thickness requirements may be formed using the monocrystalline silicon substrate on a single SOI substrate. Accordingly, packaging costs can be reduced, and a semiconductor chip scale package (CSP) having reduced feature sizes and improved performance can be formed using the SOI substrate of FIG. 1G.

FIG. 2 is a flowchart of the steps in an exemplary method of manufacturing the SOI substrate.

First, referring to Step S101, a first semiconductor substrate (e.g. first semiconductor substrate 100) is provided. An island-shaped insulating layer (e.g. island-shaped insulating layer 101) is formed on a first surface of the first semiconductor substrate in a first region (e.g. first region A1). See, for example, FIG. 1C.

Next, referring to Step S102, a silicon epitaxial layer (e.g. silicon epitaxial layer 102) is formed on the first surface of the first semiconductor substrate so as to cover the island-shaped insulating layer. See, for example, FIG. 1D.

Next, referring to Step S103, a trench (e.g. trench 1021) is formed by etching the silicon epitaxial layer so as to expose the island-shaped insulating layer. See, for example, FIG. 1E.

Next, referring to Step S104, a first insulating adhesive layer (e.g. first insulating adhesive layer 103) is formed on the silicon epitaxial layer and the island-shaped insulating layer, so as to fill the trench. See, for example, FIG. 1F.

Next, referring to Step S105, the first semiconductor substrate and a second semiconductor substrate (e.g. second semiconductor substrate 200) are bonded together using at least the first insulating adhesive layer, thereby forming the SOI substrate. See, for example, FIG. 1F.

Figure 3:
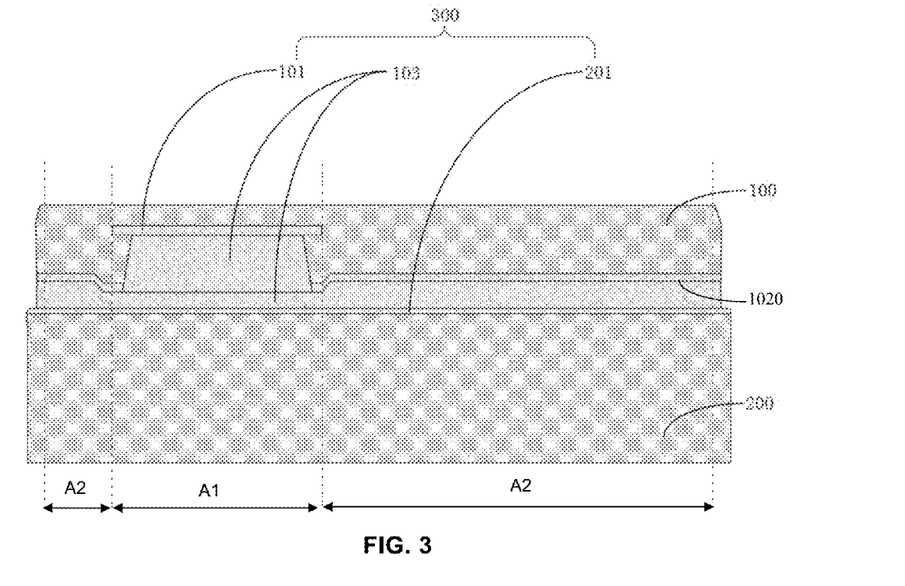
FIG. 3 depicts a cross-sectional view of a SOI substrate according to an embodiment of the inventive concept.

FIG. 3 depicts a cross-sectional view of a SOI substrate according to an exemplary embodiment of the inventive concept.

Referring to FIG. 3, the SOI substrate includes a first semiconductor substrate 100, a second semiconductor substrate 200, and a buried insulating layer 300 disposed therebetween. The first semiconductor substrate 100 may include a monocrystalline silicon substrate. The first semiconductor substrate 100 may be used to form semiconductor devices (e.g. transistors), while the second semiconductor substrate 200 may serve as a carrier (or base) substrate. The first semiconductor substrate 100 may be formed having different thicknesses in different regions. For example, as shown in FIG. 3, a thickness of the first semiconductor substrate 100 is lower in a first region A1 than in a second region A2.

An island-shaped insulating layer 101 and a first insulating adhesive layer 103 are disposed on the first semiconductor substrate 100. As shown in FIG. 3, a portion of the first insulating adhesive layer 103 is disposed in a trench formed in the first semiconductor substrate 100, and disposed in contact with a portion of the island-shaped insulating layer 101.

A second insulating adhesive layer 201 is disposed on a surface of the second semiconductor substrate 200. The island-shaped insulating layer 101, the first insulating adhesive layer 103, and the second insulating adhesive layer 201 collectively constitute the buried insulating layer 300. The buried insulating layer 300 extends into at least one region (e.g. the first region A1) of the first semiconductor substrate 100, as shown in FIG. 3.

The first semiconductor substrate 100 and the second semiconductor substrate 200 may be bonded together via the first insulating adhesive layer 103 and the second insulating adhesive layer 201.

In some embodiments, the buried insulating layer 300 may be formed as a single layer structure. In other embodiments, the buried insulating layer 300 may be formed as a double-layered or multi-layered structure.

In some embodiments, the first insulating adhesive layer 103 and the second insulating adhesive layer 201 may each be formed of an oxide or any other appropriate dielectric adhesive material. In some preferred embodiments, the island-shaped insulating layer 101, the first insulating adhesive layer 103 and the second insulating adhesive layer 201 may be formed of a same material (for example, an oxide).

In the embodiment of FIG. 3, the monocrystalline silicon substrate located above the buried insulating layer 300 is formed having different thicknesses in different regions. As a result, different types of transistors having different thickness requirements may be formed using the monocrystalline silicon substrate on a single SOI substrate. Accordingly, packaging costs can be reduced, and a semiconductor chip scale package (CSP) having reduced feature sizes and improved performance can be formed using the SOI substrate of FIG. 3.

A SOI substrate and a method of manufacturing the SOI substrate according to different embodiments of the inventive concept have been described above. In order to avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and do not limit the scope of the inventive concept. Furthermore, those skilled in the art would appreciate that various modifications can be made to the different embodiments without departing from the scope of the inventive concept.

What is claimed is:

1. A method of manufacturing a silicon-on-insulator (SOI) substrate, comprising:

forming a thinning stop layer within a first semiconductor substrate distanced from a first surface of the first semiconductor substrate;

forming an island-shaped insulating layer on a first region of the first surface of the first semiconductor substrate;

forming a silicon epitaxial layer on the first surface of the first semiconductor substrate so as to cover the island-shaped insulating layer and a second region of the first surface of the first semiconductor substrate, wherein the silicon epitaxial layer has a uniform thickness over the first surface of the first semiconductor substrate;

forming a trench by selectively etching the first region of the silicon epitaxial layer so as to expose a portion of the island-shaped insulating layer;

forming a first insulating adhesive layer on the second region of the silicon epitaxial layer and the island-shaped insulating layer, wherein the first semiconductor substrate has a first thickness of the first surface in the first region that is determined by a distance between the thinning stop layer and the island-shaped insulating layer, and wherein the first semiconductor substrate has a second thickness of the first surface in the second region that is determined by a sum of the first thickness and the uniform thickness of the silicon epitaxial layer; and thinning the first semiconductor substrate from a second surface of the first semiconductor substrate, wherein the second surface is on an opposing side of the first surface of the first semiconductor substrate; and wherein the thinning of the first semiconductor substrate includes a coarse grinding process to remove a part of the first semiconductor substrate before reaching the thinning stop layer and a fine grinding process to remove the thinning stop layer.

2. The method of claim 1, wherein forming the island-shaped insulating layer further comprises:

forming an oxide layer on the first surface of the first semiconductor substrate;

forming a first hard mask layer on the first oxide layer;

etching the oxide layer using the first hard mask layer as an etch mask, so as to remove portions of the oxide layer lying outside the first region; and removing the first hard mask layer.

3. The method of claim 1, wherein forming the trench further comprises: optically aligning the first semiconductor substrate, and etching the silicon epitaxial layer using a laser.

4. The method of claim 1, wherein forming the trench further comprises:
   forming a second hard mask layer on a surface of the silicon epitaxial layer;
   forming an opening in the second hard mask layer in the first region by removing a portion of the second hard mask layer disposed above the island-shaped insulating layer;
   etching the silicon epitaxial layer using the second hard mask layer as an etch mask, so as to form the trench in the silicon epitaxial layer in the first region; and
   removing the second hard mask layer.

5. The method of claim 1, further comprising:
   bonding the first semiconductor substrate and a second semiconductor substrate using the first insulating adhesive layer and a second insulating adhesive layer disposed on the second semiconductor substrate, so as to form the SOI substrate.

6. The method of claim 1, further comprising:
   planarizing the first insulating adhesive layer after forming the first insulating adhesive layer.

7. The method of claim 5, wherein the island-shaped insulating layer, the first insulating adhesive layer, and the second insulating adhesive layer are formed of a same material.

8. The method of claim 1, wherein forming the thinning stop layer further comprises:
   forming a first sacrificial layer on the first surface of the first semiconductor substrate; and
   performing ion implantation on the first surface of the first semiconductor substrate, so as to form the thinning stop layer in the first semiconductor substrate.

9. The method of claim 8, further comprising:
   annealing the first semiconductor substrate after performing the ion implantation.

10. The method of claim 1, wherein at least one corner or edge of the first semiconductor substrate is chamfered.

\* \* \* \* \*